(12) United States Patent
Hikita et al.

(10) Patent No.: US 8,441,035 B2
(45) Date of Patent: May 14, 2013

(54) FIELD EFFECT TRANSISTOR AND METHOD OF MANUFACTURING THE SAME

(75) Inventors: Masahiro Hikita, Toyama (JP); Hidetoshi Ishida, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/150,574

(22) Filed: Jun. 1, 2011

(65) Prior Publication Data
US 2011/0227093 A1     Sep. 22, 2011

Related U.S. Application Data

(63) Continuation of application No. PCT/JP2009/006372, filed on Nov. 26, 2009.

(30) Foreign Application Priority Data

Dec. 5, 2008 (JP) .................................. 2008-311417

(51) Int. Cl.
*H01L 29/778* (2006.01)

(52) U.S. Cl.
USPC .... 257/192; 257/194; 257/196; 257/E29.249; 257/E29.091

(58) Field of Classification Search .................... 257/76, 257/183–201, 249, E29.242, E21.409, E29.089, 257/E29.312, E21.446, E29.249; 438/142, 438/172, 174, 226, 481
See application file for complete search history.

(56) References Cited

U.S. PATENT DOCUMENTS

| 7,038,252 B2 | 5/2006 | Saito et al. |
| 7,508,015 B2 | 3/2009 | Saito et al. |

(Continued)

FOREIGN PATENT DOCUMENTS

| JP | 2005-244072 | 9/2005 |
| JP | 2007-035905 | 2/2007 |

(Continued)

OTHER PUBLICATIONS

Wu, J.et al. "Universal Bandgap Bowing in Group-III Nitrided Alloys." Solid State Communications. 127. (2003): 411-414.*

(Continued)

*Primary Examiner* — Colleen Matthews
*Assistant Examiner* — Lauren Bell
(74) *Attorney, Agent, or Firm* — McDermott Will & Emery LLP (57) ABSTRACT

The present invention has an object to provide an FET and a method of manufacturing the FET that are capable of increasing the threshold voltage as well as decreasing the on-resistance. The FET of the present invention includes a first undoped GaN layer; a first undoped AlGaN layer formed on the first undoped GaN layer, having a band gap energy greater than that of the first undoped GaN layer; a second undoped GaN layer formed on the first undoped AlGaN layer; a second undoped AlGaN layer formed on the second undoped GaN layer, having a band gap energy greater than that of the second undoped GaN layer; a p-type GaN layer formed in the recess of the second undoped AlGaN layer; a gate electrode formed on the p-type GaN layer; and a source electrode and a drain electrode which are formed in both lateral regions of the gate electrode, wherein a channel is formed at the heterojunction interface between the first undoped GaN layer and the first undoped AlGaN layer.

18 Claims, 5 Drawing Sheets

U.S. PATENT DOCUMENTS

| | | | |
|---|---|---|---|
| 7,576,373 B1 * | 8/2009 | Hikita et al. | 257/192 |
| 7,683,399 B2 | 3/2010 | Ishida et al. | |
| 7,821,036 B2 | 10/2010 | Ehara | |
| 7,838,904 B2 | 11/2010 | Nakazawa et al. | |
| 7,863,649 B2 * | 1/2011 | Hikita et al. | 257/194 |
| 2005/0189559 A1 | 9/2005 | Saito et al. | |
| 2006/0138454 A1 | 6/2006 | Saito et al. | |
| 2007/0045670 A1 * | 3/2007 | Kuraguchi | 257/249 |
| 2007/0278521 A1 | 12/2007 | Ishida et al. | |
| 2008/0087915 A1 * | 4/2008 | Uemoto et al. | 257/192 |
| 2008/0093626 A1 | 4/2008 | Kuraguchi | |
| 2008/0164527 A1 | 7/2008 | Kataoka et al. | |
| 2008/0179694 A1 | 7/2008 | Nakazawa et al. | |
| 2008/0284022 A1 | 11/2008 | Ehara | |
| 2009/0008677 A1 | 1/2009 | Kikkawa | |
| 2011/0024797 A1 | 2/2011 | Nakazawa et al. | |
| 2011/0095335 A1 | 4/2011 | Ishida et al. | |
| 2011/0227132 A1 * | 9/2011 | Anda et al. | 257/192 |

FOREIGN PATENT DOCUMENTS

| | | |
|---|---|---|
| JP | 2007-067240 | 3/2007 |
| JP | 2007/220895 | 8/2007 |
| JP | 2007-329205 | 12/2007 |
| JP | 2008-084942 | 4/2008 |
| JP | 2008-103617 | 5/2008 |
| JP | 2008-147524 | 6/2008 |
| JP | 2008-153350 | 7/2008 |
| JP | 2008-211172 | 9/2008 |
| WO | 2007/108055 | 9/2007 |

OTHER PUBLICATIONS

Machine translation of JP 2007035905, retrieved Sep. 24, 2012.*

T. Kawasaki et al., "Normally-off AlGaN/GaN HEMT with Recessed Gate for High Power Applications", Extended Abstracts of the 2005 International Conference on Solid State Devices and Materials, Kobe, 2005, pp. 206-207.

M. Kuroda et al., "Normally-off Operation of Non-polar AlGaN/GaN Heterojunction FETs", Extended Abstracts of the 2005 International Conference on Solid State Devices and Materials, Kobe, 2005, pp. 470-471.

U.S. Appl. No. 13/185,818 to Hidekazu Umeda et al., filed Jul. 19, 2011.

International Search Report for corresponding PCT Application No. PCT/JP2009/006372, mailed Feb. 1, 2010.

* cited by examiner

FIELD EFFECT TRANSISTOR AND METHOD OF MANUFACTURING THE SAME

CROSS REFERENCE TO RELATED APPLICATION

This is a continuation application of PCT application No. PCT/JP2009/006372 filed on Nov. 26, 2009, designating the United States of America.

BACKGROUND OF THE INVENTION (1) Field of the Invention

The present invention relates to a field effect transistor and a method of manufacturing the field effect transistor, and particularly relates to a field effect transistor composed of a group III nitride semiconductor and a method of manufacturing the field effect transistor.

(2) Description of the Related Art

In recent years, field effect transistors (FET) as power switching devices using gallium nitride (GaN) based materials have been actively researched. Nitride semiconductor materials such as GaN can be combined with aluminum nitride (AlN) or indium nitride (InN) to form various mixed crystals, and thus can form a heterojunction similarly to the arsenic-based semiconductor material such as conventional gallium arsenide (GaAs). Especially, the heterojunction of a nitride semiconductor has such characteristics that high concentrations of carriers occur at the hetero-interface due to spontaneous polarization and piezoelectric polarization even in a state where the heterojunction is not doped. Consequently, in the case where an FET is made of nitride semiconductor material, the FET tends to be depletion type (normally-on), thus it is difficult to obtain an enhancement type (normally-off) characteristics. However, most devices currently used in the power electronics market are normally-off, which is highly demanded for an FET made of GaN-based nitride semiconductor materials.

Examples of methods for achieving a normally-off FET include a method of shifting a threshold voltage to a higher level by using recessed gate (for example, see T. Kawasaki et al, "Solid State Devices and Materials", 2005, tech. digest, pp 206, hereinafter referred to as Non-Patent Reference 1), and another method of fabricating the FET on the (10-12) plane of a sapphire substrate so that no polarization electric field is generated in the crystal growth direction of a nitride semiconductor (for example, see M. Kuroda et al, "Solid State Devices and Materials", 2005, tech. digest, pp 470, hereinafter referred to as Non-Patent Reference 2). As a promising structure for normally-off FET, Junction Field Effect Transistor (JFET) in which p-type GaN layer is formed in the gate has been proposed (for example, see Japanese Unexamined Patent Application Publication No. 2005-244072, hereinafter referred to as Patent Reference 1).

Figure 7:
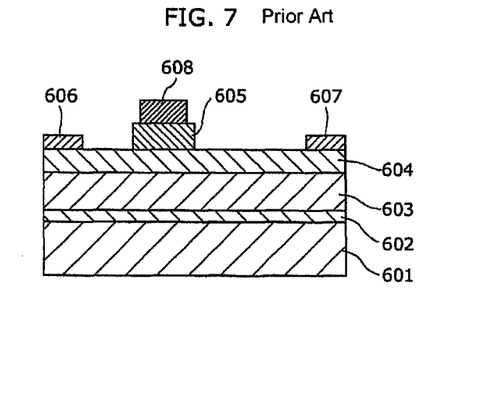
FIG. 7 is a cross-sectional view showing the structure of a JFET according to a conventional embodiment.

FIG. 7 shows a cross-sectional view of the JFET in Patent Reference 1.

In the JFET, an AlN buffer layer 602, an undoped GaN layer 603, an undoped AlGaN barrier layer 604, and a p-type GaN layer 605 are sequentially formed on a substrate 601 composed of sapphire. Furthermore, a gate electrode 608 is formed on the p-type GaN layer 605; and a source electrode 606 and a drain electrode 607 are formed on the undoped AlGaN barrier layer 604.

In the JFET, the piezoelectric polarization occurred in the heterojunction interface between the undoped GaN layer 603 and the undoped AlGaN barrier layer 604 is cancelled by the piezoelectric polarization occurred in the heterojunction interface between the undoped AlGaN barrier layer 604 and the p-type GaN layer 605. Thereby, two-dimensional electron gas density immediately below the gate electrode 608 can be reduced, and normally-off characteristics can be achieved. In addition, by using a p-n junction with a built-in potential greater than that of Schottky junction for the gate, the gate turn on voltage can be increased, which is advantageous in reducing the gate leakage current even with a positive gate voltage applied.

SUMMARY OF THE INVENTION

However, in order to increase the threshold voltage in the positive direction in a conventional JFET, two-dimensional electron gas density needs to be reduced by decreasing the Al composition ratio of the undoped AlGaN barrier layer 604 or by thinning the undoped AlGaN barrier layer 604 to reduce the polarization charge. In this case, there is a problem in that on-resistance increases because the channel resistances between the gate and source electrodes, and between the gate and drain electrodes increase along with the increase in the threshold voltage (in the positive direction).

In addition, after the above-mentioned JFET is actually fabricated by the inventors, a problem was found that when the gate is turned on immediately after the gate is turned off and a high drain voltage is applied, the drain current decreases and the on-resistance increases, so-called current collapse phenomenon occurs in contrast to the case where the gate is turned on without a high drain voltage being applied. The increase of the on-resistance due to the current collapse is a serious problem for the power transistor to which a high drain voltage is applied.

Now, in view of the above-mentioned problems, it is a first object of the present invention to provide a field effect transistor and a method of manufacturing the field effect transistor that are capable of increasing the threshold voltage as well as decreasing the on-resistance.

Furthermore, it is a second object of the present invention to provide a field effect transistor and a method of manufacturing the field effect transistor such that the current collapse is suppressed.

In order to solve the aforementioned problems, the field effect transistor of the present invention is characterized by including a first nitride semiconductor layer of a first conductivity type; a second nitride semiconductor layer of a first conductivity type formed on the first nitride semiconductor layer, the second nitride semiconductor layer having a band gap energy greater than a band gap energy of the first nitride semiconductor layer; a third nitride semiconductor layer of a first conductivity type formed on the second nitride semiconductor layer; a fourth nitride semiconductor layer of a first conductivity type formed on the third nitride semiconductor layer, the fourth nitride semiconductor layer having a band gap energy greater than a band gap energy of the third nitride semiconductor layer; a fifth semiconductor layer of a second conductivity type formed in a recess provided in the fourth nitride semiconductor layer; a gate electrode formed on the fifth semiconductor layer; and a source electrode and a drain electrode which are formed in respective regions near lateral sides of the gate electrode, wherein a channel is formed at a heterojunction interface between the first nitride semiconductor layer and the second nitride semiconductor layer.

With this configuration, a channel is formed not only in the heterojunction interface between the first nitride semiconductor layer and the second nitride semiconductor layer, but also in the heterojunction interface between the third nitride semiconductor layer and the fourth nitride semiconductor layer.

That is to say, in addition to the two-dimensional electron gas forming the conventional channel, another two-dimensional electron gas is formed near the surface, between the gate and source electrodes and between the gate and drain electrodes. Accordingly, a sheet resistance can be reduced, and an on-resistance can be decreased. Furthermore, the two-dimensional electron gas density immediately below the gate electrode can be selectively reduced lower than the two-dimensional electron gas density in the other area, thus the threshold voltage can be increased in the positive direction. Consequently, the on-resistance can be reduced, and the threshold voltage can be increased at the same time.

Also, in contrast to the conventional JFET, the channel between the gate and drain electrodes is spaced away from the surface of the field effect transistor, thus the influence of the surface state on the channel can be reduced. Consequently, current collapse resulting from the surface state can be suppressed.

It is preferable that the recess penetrates through a heterojunction interface between the third nitride semiconductor layer and the fourth nitride semiconductor layer. Especially, it is preferable that the recess penetrates through the third nitride semiconductor layer and the fourth nitride semiconductor layer to reach a surface of the second nitride semiconductor layer; and the surface of the second nitride semiconductor layer as a bottom surface of the recess is flush with an interface between the second nitride semiconductor layer and the third nitride semiconductor layer.

With this configuration, the threshold voltage is determined by the film thickness and the Al composition ratio of the second nitride semiconductor layer, thus the threshold voltage can be easily controlled.

Also, it is preferable that the field effect transistor further includes a sixth nitride semiconductor layer formed between the second nitride semiconductor layer and the fifth semiconductor layer. Especially, it is preferable that a difference in lattice constants between the second nitride semiconductor layer and the sixth nitride semiconductor layer is less than a difference in lattice constants between the second nitride semiconductor layer and the fifth semiconductor layer.

With this configuration, the crystal quality of the fifth semiconductor layer can be improved, thus the gate leakage current can be reduced.

Also, it is preferable that the field effect transistor further includes: a seventh nitride semiconductor layer of a first conductivity type formed on the fourth nitride semiconductor layer; and an eighth nitride semiconductor layer of a first conductivity type formed on the seventh nitride semiconductor layer, the eighth nitride semiconductor layer having a band gap energy greater than a band gap energy of the seventh nitride semiconductor layer.

With this configuration, two channels are formed near the surface between the gate and source electrodes and between the gate and drain electrodes, thus the channel resistance can be further reduced, and the on-resistance can be further decreased.

Also, it is preferable that the source electrode and the drain electrode each of which is in contact with the heterojunction interface between the first nitride semiconductor layer and the second nitride semiconductor layer, and with the heterojunction interface between the third nitride semiconductor layer and the fourth nitride semiconductor layer.

With this configuration, the contact resistances of the source electrode and the drain electrode can be reduced.

Also, it is preferable that the field effect transistor is a normally-off transistor.

With this configuration, a normally-off FET can be achieved that is capable of increasing the threshold voltage as well as decreasing the on-resistance.

Also, the present invention may be a method of manufacturing a field effect transistor including: epitaxially growing a first conductivity type or undoped, second nitride semiconductor layer, having a band gap energy greater than a band gap energy of the first nitride semiconductor, a first conductivity type or undoped, third nitride semiconductor layer, and a first conductivity type or undoped, fourth nitride semiconductor layer having a band gap energy greater than a band gap energy of the third nitride semiconductor sequentially on the first nitride semiconductor layer; forming a recess by selectively removing a part of the fourth nitride semiconductor layer; epitaxially growing a second conductivity type, fifth semiconductor layer in the recess; and forming a gate electrode on the fifth semiconductor layer.

According to this method, a field effect transistor can be manufactured that is capable of increasing the threshold voltage as well as decreasing the on-resistance, while the current collapse is suppressed.

Also, it is preferable that in the forming of a recess, the third nitride semiconductor exposed by removing the fourth nitride semiconductor layer is removed by using an etching method with which the second nitride semiconductor layer is etched slower than the third nitride semiconductor layer is etched.

According to this method, when the third nitride semiconductor layer is etched and the surface of the second nitride semiconductor layer is exposed, the second nitride semiconductor layer is not etched. Accordingly, the film thickness of the second nitride semiconductor layer immediately below the gate electrode can be precisely controlled.

As described above, according to the field effect transistor and the method of manufacturing the field effect transistor of the present invention, a normally-off FET and a method of manufacturing the normally-off FET can be achieved that are capable of increasing the threshold voltage as well as decreasing the on-resistance. At the same time, the normally-off FET and the manufacturing method are achieved such that the current collapse is suppressed.

FURTHER INFORMATION ABOUT TECHNICAL BACKGROUND TO THIS APPLICATION

The disclosure of Japanese Patent Application No. 2008-311417 filed on Dec. 5, 2008 including specification, drawings and claims is incorporated herein by reference in its entirety.

The disclosure of PCT application No. PCT/JP2009/006372 filed on Nov. 26, 2009, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Hereinafter, a field effect transistor and a method of manufacturing the field effect transistor in the embodiments of the present invention are described with reference to the drawings.

First Embodiment

Figure 1:
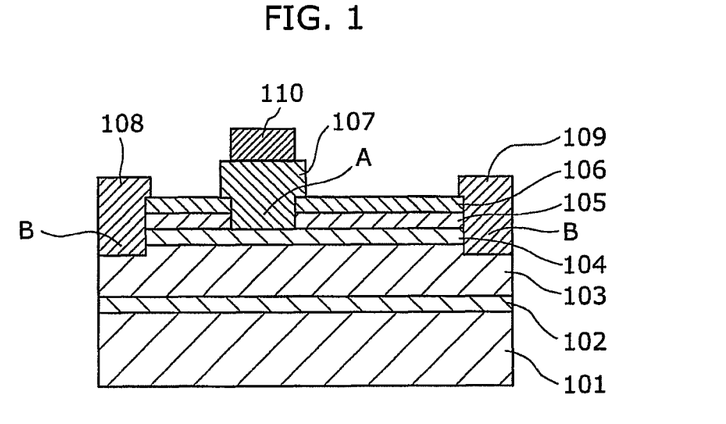
FIG. 1 is a cross-sectional view of the structure of a JFET according to a first embodiment of the present invention.

FIG. 1 is a cross-sectional view showing the structure of a JFET according to a first embodiment of the present invention.

As shown in the figure, the JFET of the present embodiment is normally-off, and includes 100 nm thick AlN buffer layer 102; 100 nm thick AlN buffer layer 102; 2 μm thick undoped GaN layer 103; 10 nm thick undoped AlGaN layer 104 with 15% of Al composition ratio; 20 nm thick undoped GaN layer 105; 25 nm thick undoped AlGaN layer 106 with 25% of Al composition ratio; and 100 nm thick p-type GaN layer 107 on the (0001) plane of a substrate 101 composed of sapphire. A gate electrode 110 is formed on the p-type GaN layer 107; and a source electrode 108 and a drain electrode 109 are formed in both lateral regions of the gate electrode 110. "Undoped" herein means that an impurity is not intentionally doped.

In the source and drain regions of the undoped AlGaN layer 104, the undoped GaN layer 105, and the undoped AlGaN layer 106, a recess (B in FIG. 1) is formed that extends from the surface of the undoped AlGaN layer 106 through the undoped AlGaN layer 106, the undoped GaN layer 105, and the undoped AlGaN layer 104 to the undoped GaN layer 103. The source and drain regions mean the areas in which the source electrode 108 and the drain electrode 109 are formed, respectively.

In the gate regions of the undoped GaN layer 105 and the undoped AlGaN layer 106, a recess (A in FIG. 1) is formed that extends from the surface of the undoped AlGaN layer 106 through the undoped AlGaN layer 106 and the undoped GaN layer 105 to the undoped AlGaN layer 104. In other words, the recess (A in FIG. 1) is formed that passes through the heterojunction interface between the undoped AlGaN layer 106 and the undoped GaN layer 105. The surface of the undoped AlGaN layer 104 as the bottom face of the recess (A in FIG. 1) is flush with the interface between the undoped AlGaN layer 104 and the undoped GaN layer 105. However, "flush" may include a state with a difference in height in the order of several nm with respect to the surface of the undoped AlGaN layer 104 due to the precision of etching. The p-type GaN layer 107 is formed in the gate region so as to fill the recess (A in FIG. 1) of the undoped GaN layer 105 and the undoped AlGaN layer 106. The gate region means the region where the gate electrode 110 and the p-type GaN layer 107 are formed.

In the recess (B in FIG. 1) of the undoped AlGaN layer 106, the undoped GaN layer 105, and the undoped AlGaN layer 104, and above the undoped GaN layer 103, the source electrode 108 and the drain electrode 109 including a Ti layer and an Al layer are provided so as to transversely come into contact with the heterojunction interface between the undoped AlGaN layer 104 and the undoped GaN layer 103 as well as the heterojunction interface between the undoped GaN layer 105 and the undoped AlGaN layer 106. By forming the source electrode 108 and the drain electrode 109 so as to come into direct contact with the two-dimensional electron gas in this manner, the contact resistance between the electrodes and those semiconductor layers can be reduced. Also, on the p-type GaN layer 107, the gate electrode 110 composed of Pd is provided forming an ohmic junction to the p-type GaN layer 107.

The most part of the p-type GaN layer 107 is doped with Mg in the order of $1 \times 10^{19}$ cm$^{-3}$ resulting in a carrier concentration in the order of $1 \times 10^{18}$ cm$^{-3}$, however, the region in the p-type GaN layer 107, approximately within 10 nm from the junction interface with the gate electrode 110 is doped with Mg in the order of $1 \times 10^{20}$ cm$^{-3}$.

The p-type GaN layer 107 is formed at a position near the source electrode 108. This is because the electric field generated as a high drain voltage is applied is to be reduced and the breakdown voltage of the transistor is to be increased by increasing the distance between the gate electrode 110 and the drain electrode 109.

The undoped GaN layer 103 is an example of the first nitride semiconductor layer of the present invention; the undoped AlGaN layer 104 is an example of the second nitride semiconductor layer of the present invention; the undoped GaN layer 105 is an example of the third nitride semiconductor layer of the present invention; the undoped AlGaN layer 106 is an example of the fourth nitride semiconductor layer of the present invention; and the p-type GaN layer 107 is an example of the fifth semiconductor layer of the present invention. Also, n-type is an example of a first conductivity type of the present invention, and a p-type is an example of a second conductivity type of the present invention.

Figure 2A:
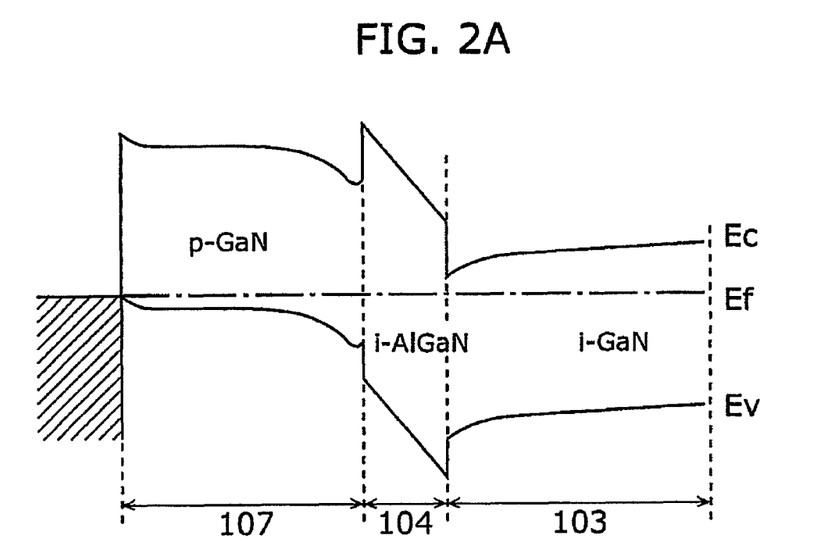
FIG. 2A is a diagram of the energy band immediately below the gate electrode of the JFET according to the first embodiment.

FIG. 2A shows a diagram of the energy band immediately below the gate electrode 110 of the JFET according to the present embodiment.

In the case where the gate bias is 0, the heterojunction interface between the undoped AlGaN layer 104 and the undoped GaN layer 103 has a configuration in which no two-dimensional electron gas is generated, thus the resulting FET is normally-off. In order to achieve normally-off characteristics and also a positive large value of the threshold voltage, the Al composition ratio of the undoped AlGaN layer 104 is preferably small and its film thickness is preferably thin.

Figure 2B:
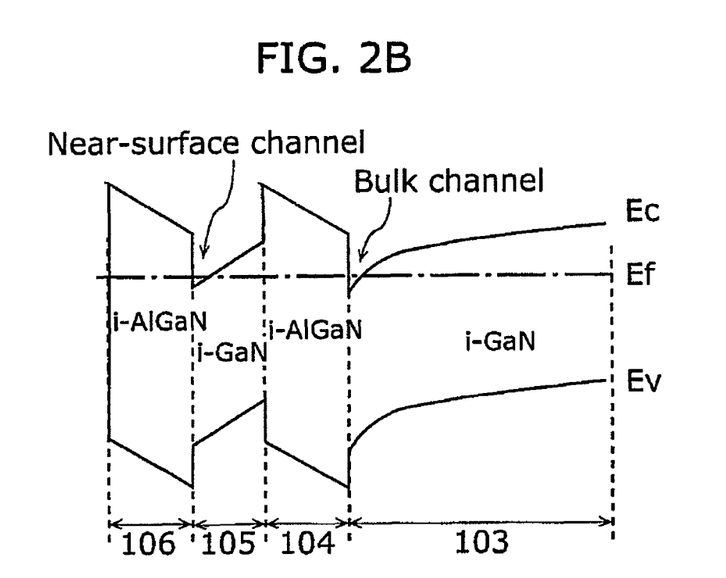
FIG. 2B is a diagram of the energy band between the gate and source electrodes and between the gate and drain electrodes of the JFET according to the first embodiment.

FIG. 2B shows a diagram of the energy band between the gate and source electrodes and between the gate and drain electrodes of the JFET according to the present embodiment.

In the case where the gate bias is 0, two-dimensional electron gas is generated to form a channel (which is called a bulk channel) at the heterojunction interface between the undoped AlGaN layer 104 and the undoped GaN layer 103, while two-dimensional electron gas is also generated to form another channel near the surface (which is called a near-surface channel) at the heterojunction interface between the undoped AlGaN layer 106 and the undoped GaN layer 105. Because two channels are formed on the bulk and surface sides, respectively between the gate and source electrodes and between the gate and drain electrodes, the total channel resistance is reduced. Although a potential barrier exists between these two channels, because electrons can tunnel through the potential barrier, the electrons in the channel near the surface also contribute as the drain current. Accordingly, the on-resistance for the reduced channel resistance between the gate and source electrodes and between the gate and drain electrodes can be decreased.

In order to generate electrons in the near-surface channel more effectively and to reduce the channel resistance, and further to guide the electrons in the near-surface channel to the bulk channel more effectively, the Al composition ratio of the undoped AlGaN layer 106 is preferably greater than that of the undoped AlGaN layer 104, and the film thickness of the undoped AlGaN layer 106 is preferably thicker than that of the undoped AlGaN layer 104.

Also, in contrast to the conventional JFET, the influence of the surface state on the channel can be reduced because the bulk channel between the gate and drain electrodes is spaced away from the surface of the JFET. Consequently, current collapse resulting from the surface state can be suppressed.

The current collapse can be considered to be caused by the electrons trapped on the surface state. In the case of the conventional JFET shown in FIG. 7, applying a high drain bias in the order of several tens V when the gate is off depletes the two-dimensional electron gas between the gate and drain because of the electrons trapped on the surface state of the undoped AlGaN barrier layer 604. Because the emission time of the electrons trapped on the surface state is longer than their trapping time, a depletion layer extends between the gate and drain immediately after the gate is turned on. For this reason, the channel does not open completely, and the channel resistance is considered to be increased.

On the other hand, in the JFET of the present embodiment, which includes the undoped AlGaN layer 106 and the undoped GaN layer 105, the distance between the bulk channel and the surface of the JFET is increased. Accordingly, even in the case where a high drain bias is applied when the gate is off, the two-dimensional electron gas between the gate and drain is not depleted. Accordingly, even immediately after the gate is turned on, the channel is completely open, and the channel resistance does not increase.

Hereinafter, the method of manufacturing the JFET according to the present embodiment is described.

Figure 3:
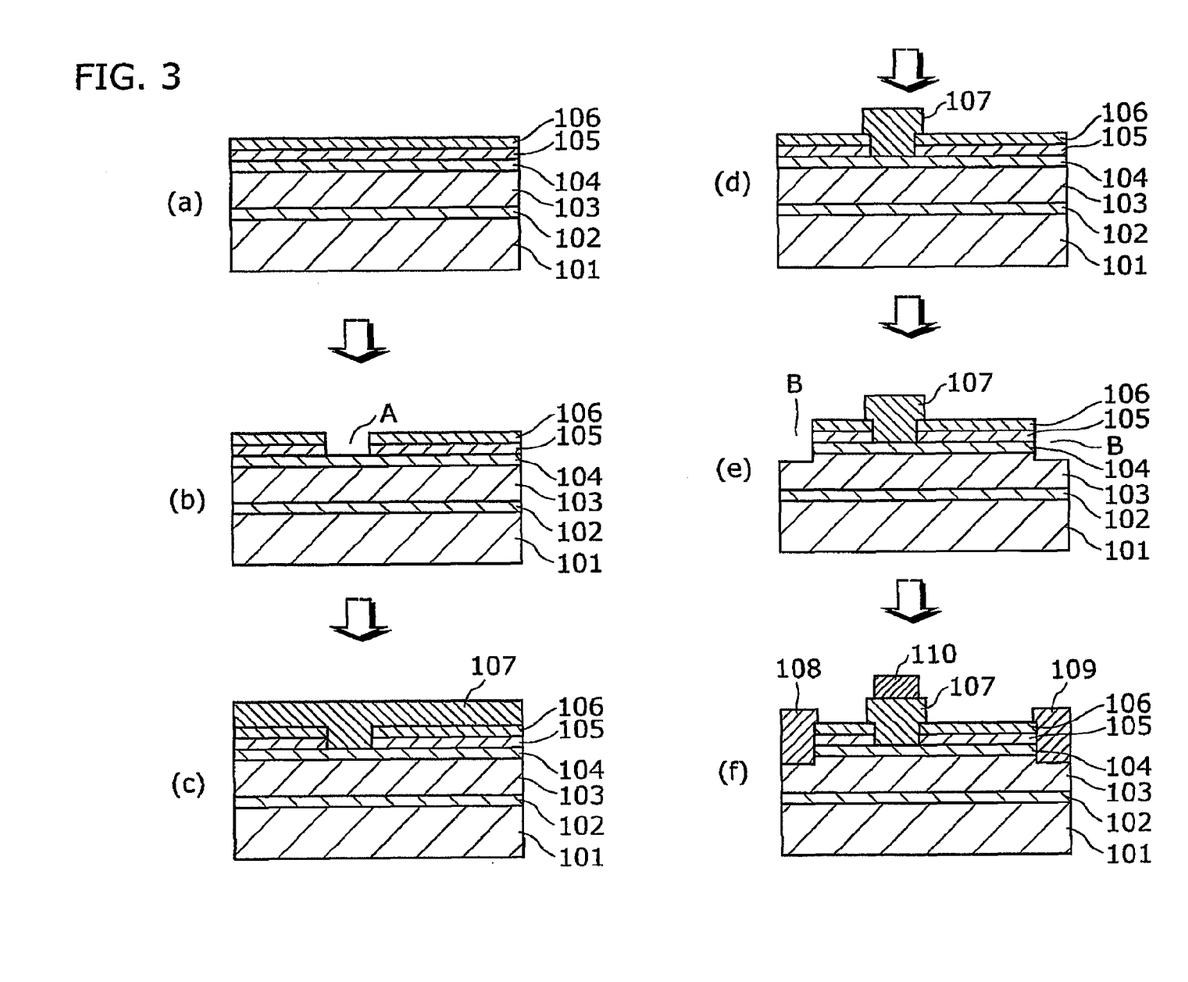
FIG. 3 is a cross-sectional view of a JFET for illustrating a method of manufacturing the JFET according to the first embodiment.

FIG. 3 is a cross-sectional view for illustrating the method of manufacturing the JFET according to the present embodiment.

First, as shown in FIG. 3(a), by using Metal Organic Chemical Vapor Deposition (MOCVD) on the (0001) plane of the substrate 101, the AlN buffer layer 102, the undoped GaN layer 103, the undoped AlGaN layer 104, the undoped GaN layer 105, and the undoped AlGaN layer 106 are epitaxially grown sequentially.

Next, as shown in FIG. 3(b), a part of the undoped AlGaN layer 106 and the undoped GaN layer 105 is selectively removed in the gate region, for example, by dry etching such as ICP (Inductive-Coupled Plasma) etching, and a recess as a gate recess (A in FIG. 3(b)) is formed in the undoped GaN layer 105 and the undoped AlGaN layer 106. At this point, the undoped AlGaN layer 104 is preferably etched slower than the undoped GaN layer 105 is etched, for example, by using only chlorine gas to etch the undoped AlGaN layer 106, and switching to selective dry etching using additional oxygen gas in the middle of etching the undoped GaN layer 105. In this manner, by etching the undoped GaN layer 105 using an etching method with which the undoped AlGaN layer 104 is etched slower than the undoped GaN layer 105 is etched, i.e., the selective etching, etching residue of the undoped GaN layer 105 is removed, and a recess of the gate region can be formed with a sufficient reproducibility almost without etching the undoped AlGaN layer 104. Consequently, a variation in the film thickness of the undoped AlGaN layer 104 immediately below the gate electrode 110 is suppressed, thus the reproducibility of the threshold voltage can be improved.

Next, as shown in FIG. 3(c), p-type GaN layer 107 is epitaxially grown by the MOCVD method on the undoped AlGaN layer 104 in the recess of the gate region of the undoped AlGaN layer 106 and the undoped GaN layer 105. The p-type GaN layer 107 may be grown in only the gate region by using a mask made of insulating film such as a silicon oxide film. In this case, the process of etching the p-type GaN layer 107 can be skipped.

Next, as shown in FIG. 3(d), portions formed in regions other than the gate region of the p-type GaN layer 107 are selectively removed, for example, by ICP dry etching using chlorine gas with oxygen gas added.

Next, as shown in FIG. 3(e), a part of the undoped AlGaN layer 106, the undoped GaN layer 105, the undoped AlGaN layer 104, and the undoped GaN layer 103 in the source and drain regions is selectively removed, for example, by ICP dry etching using chlorine gas, then a recess as an ohmic recess (B in FIG. 3(e)) is formed.

Next, as shown in FIG. 3(f), a Ti layer and an Al layer are formed in the ohmic recess, then later heat treatment is performed at 650□ in a nitrogen atmosphere to form the source electrode 108 and the drain electrode 109. Subsequently, a gate electrode 110 composed of Pd is formed on the p-type GaN layer 107.

According to the JFET of the present embodiment as described above, two channels, i.e., the bulk channel and the near-surface channel are formed between the gate and source electrodes and between the gate and drain electrodes. In the case where the Al composition ratio of the undoped AlGaN layer 104 is reduced, or the undoped AlGaN layer 104 is made thinner to increase the threshold voltage, the channel resistance of the bulk channel increases, and consequently the on-resistance increases. However, the corresponding increase can be compensated by the reduction in the channel resistance of the near-surface channel, thus overall on-resistance can be reduced. Accordingly, the threshold voltage can be increased, and the on-resistance can be reduced at the same time.

Also, according to the JFET of the present embodiment, the undoped AlGaN layer 106 and the undoped GaN layer 105 are formed between exposed surface of the JFET and the bulk channel, thus the distance between the bulk channel and the surface of the JFET is increased. Accordingly, the influence of the surface state can be reduced and the current collapse resulting from the surface state can be suppressed.

(Variation)

A modification of the present embodiment is described.

Figure 4:
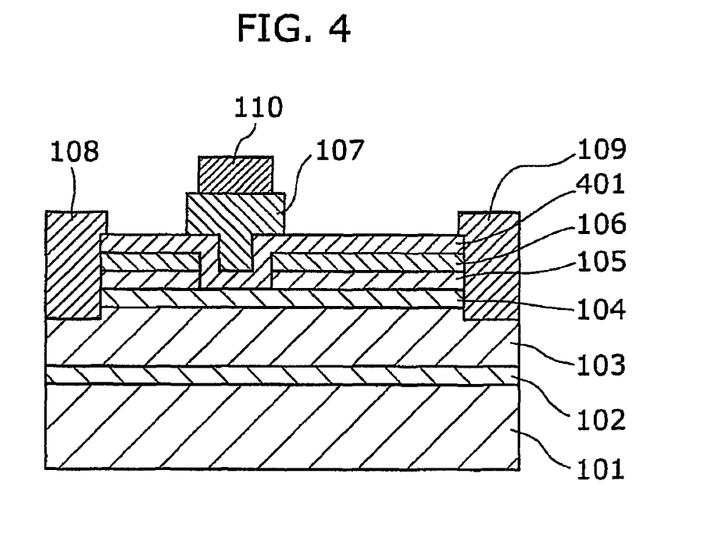
FIG. 4 is a cross-sectional view showing the structure of a modification of the JFET according to the first embodiment.

FIG. 4 is a cross-sectional view showing the structure of a modification of the JFET according to the present embodiment. In FIG. 4, description is omitted by labeling the same components as in FIG. 1 with the same reference symbols.

The JFET of the present modification differs from the JFET of FIG. 1 in that 5 nm thick undoped AlGaN layer 401 is provided between the p-type GaN layer 107 and the undoped AlGaN layers 104. The undoped AlGaN layer 401 has the same lattice constant as that of the undoped AlGaN layer 104. Accordingly, the difference between the lattice constants of the undoped AlGaN layer 104 and the undoped AlGaN layer 401 is less than the difference between the lattice constants of the undoped AlGaN layer 104 and the p-type GaN layer 107.

With this configuration, crystal quality of the surface of the undoped AlGaN layer 104 in the recess of the gate region of the undoped GaN layer 105 and the undoped AlGaN layer 106 can be improved where the surface is exposed during the process of manufacturing of the JFET, and serves as a re-growth surface. Consequently, the crystal quality of the p-type GaN layer 107 can be improved, and the gate leakage current can be reduced.

The undoped AlGaN layer 401 is an example of the sixth nitride semiconductor layer of the present invention.

The JFET of the present modification is obtained by sequentially growing the undoped AlGaN layer 401 and the p-type GaN layer 107 on the undoped AlGaN layer 104 in the recess of the gate region of the undoped GaN layer 105 and the undoped AlGaN layer 106 in the epitaxial growth process shown in FIG. 3(c) in the manufacturing method for JFET shown in FIG. 3. In order to reduce the mismatch between the lattice constants of the foundation layer and the growth layer in the gate region in the epitaxial growth, and to grow the p-type GaN layer 107 with an improved crystal quality, the Al composition ratio of the undoped AlGaN layer 401 is set to equal or less than the Al composition ratio of the undoped AlGaN layer 104.

Second Embodiment

Figure 5:
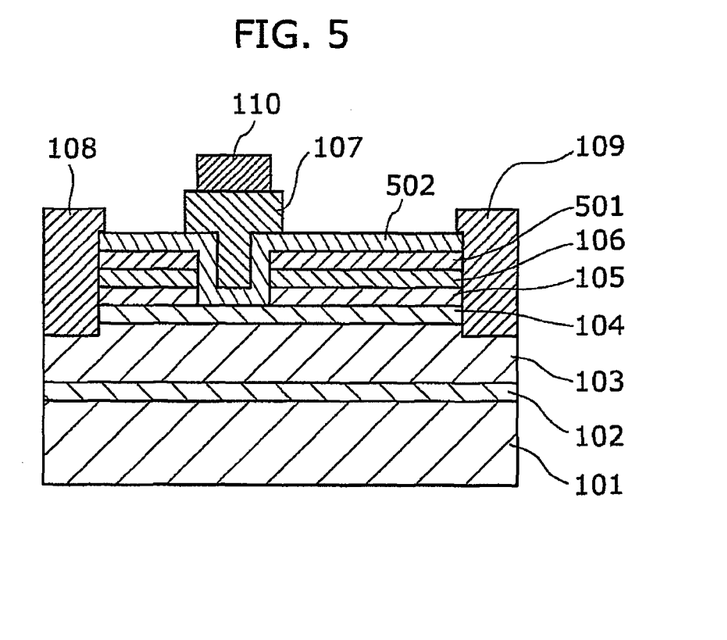
FIG. 5 is a cross-sectional view showing the structure of a JFET according to a second embodiment of the present invention.

FIG. 5 is a cross-sectional view showing the structure of a JFET according to a second embodiment of the present invention.

As shown in FIG. 5, the JFET of the present embodiment differs from the JFET of the first embodiment in that the heterojunction interface made between the undoped AlGaN layer 502 and the undoped GaN layer 501 is provided between the gate and source electrodes and between the gate and drain electrodes. Specifically, the JFET of the present embodiment differs from the JFET of the first embodiment in that the undoped GaN layer 501 is provided on the undoped AlGaN layer 106, and the undoped AlGaN layer 502 is provided on the undoped GaN layer 501. Thereby, a near-surface channel is further formed between the gate and source electrodes and between the gate and drain electrodes, thus the channel resistance can be further reduced, and the on-resistance can be further decreased because of the resulting two channels. At this point, the source electrode 108 and the drain electrode 109 transversely come into contact with the heterojunction interface between the undoped GaN layer 501 and the undoped AlGaN layer 502.

The undoped GaN layer 501 is an example of a seventh nitride semiconductor layer of the present invention; and the undoped AlGaN layer 502 is an example of an eighth nitride semiconductor layer of the present invention.

Also, the JFET of the present embodiment differs from the JFET of the first embodiment in that the undoped AlGaN layer 502 is provided between the p-type GaN layer 107 and the undoped AlGaN layer 104. The difference between the lattice constants of the undoped AlGaN layer 104 and the undoped AlGaN layer 502 is less than the difference between the lattice constants of the undoped AlGaN layer 104 and the p-type GaN layer 107. Consequently, the crystal quality of the p-type GaN layer 107 can be improved, and the gate leakage current can be reduced.

Figure 6:
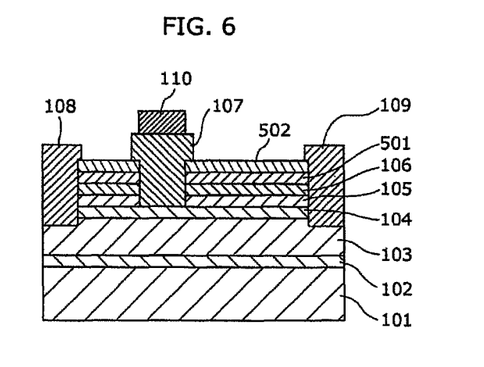
FIG. 6 is a cross-sectional view showing the structure of a modification of the JFET according to the second embodiment.

Although it has been described that the undoped AlGaN layer 502 is formed between the p-type GaN layer 107 and the undoped AlGaN layer 104 in the JFET of the present embodiment, the undoped AlGaN layer 502 may not be formed as shown in the cross-sectional view of FIG. 6.

Although the field effect transistor and the method of manufacturing the field effect transistor of the present invention have been described in the above based on the embodiments, the present invention is not limited to these embodiments. Various modifications made without departing from the spirit of the present invention, which may occur to those skilled in the art are also included within the scope of the present invention.

For example, although it has been described that the substrate 101 is composed of sapphire, the material for the substrate 101 may be Si or SiC, and the material is not limited to these as long as a nitride semiconductor layer can be formed with the material.

Also, although the undoped GaN layer 103 has been illustrated as the first nitride semiconductor layer of the present invention in the above-mentioned embodiments, the first nitride semiconductor layer is not limited to this, and may be a nitride semiconductor layer such as an n-type GaN layer.

Similarly, although the undoped AlGaN layer 104 has been illustrated as the second nitride semiconductor layer of the present invention, the second nitride semiconductor layer is not limited to this, and may be a nitride semiconductor layer such as an n-type $Al_xGa_{1-x}N$ ($0<x\leq1$) layer formed on the first nitride semiconductor layer, having a band gap energy greater than that of the first nitride semiconductor layer.

Also, although the undoped GaN layer 105 has been illustrated as the third nitride semiconductor layer of the present invention, the third nitride semiconductor layer is not limited to this, and may be a nitride semiconductor layer such as an n-type $Al_yGa_{1-y}N$ ($0\leq y\leq1$) layer formed on the second nitride semiconductor layer, having a band gap energy less than that of the second nitride semiconductor layer.

Also, although the undoped AlGaN layer 106 has been illustrated as the fourth nitride semiconductor layer of the present invention, the fourth nitride semiconductor layer is not limited to this, and may be a nitride semiconductor layer such as an n-type $Al_zGa_{1-z}N$ ($0\leq z\leq1$) layer formed on the third nitride semiconductor layer, having a band gap energy greater than that of the third nitride semiconductor layer.

Also, although the p-type GaN layer 107 has been illustrated as the fifth semiconductor layer of the present invention, the fifth semiconductor layer is not limited to this, and may be a p-type semiconductor layer such as a p-type nitride semiconductor layer or p-type oxide semiconductor layer that are formed in the recess of the gate region of the fourth nitride semiconductor layer. For example, the fifth semiconductor layer may be composed of a p-type $Al_\alpha Ga_{1-\alpha}N$ ($0\leq\alpha\leq1$), a p-type ZnO, or a p-type NiO.

Also, although the undoped AlGaN layer 401 has been illustrated as the sixth nitride semiconductor layer of the present invention, the sixth nitride semiconductor layer is not limited to this, and may be a nitride semiconductor layer such as an n-type $Al_xGa_{1-x}N$ ($0<x\leq1$) layer formed between the second nitride semiconductor layer and the fifth semiconductor layer, having a lattice constant whose difference from the lattice constant of the second nitride semiconductor layer is less than the difference from that of the fifth semiconductor layer.

Also, although the undoped GaN layer 501 has been illustrated as the seventh nitride semiconductor layer of the present invention, the seventh nitride semiconductor layer is not limited to this, and may be an n-type $Al_yGa_{1-y}N$ ($0\leq y\leq1$) layer formed on the fourth nitride semiconductor layer, having a band gap energy less than that of the fourth nitride semiconductor layer.

Also, although undoped AlGaN layer 502 has been illustrated as the eighth nitride semiconductor layer of the present invention, the eighth nitride semiconductor layer is not limited to this, and may be an n-type $Al_zGa_{1-z}N$ ($0 \leq z \leq 1$) layer formed on the seventh nitride semiconductor layer, having a band gap energy greater than that of the seventh nitride semiconductor layer.

Also, in the FET of the above-mentioned embodiments, the depth of the recess is such that the depth passes through the undoped AlGaN layer 106 and the undoped GaN layer 105, however, the depth of the recess is not limited to such depth. For example, the depth of the recess may be such that the depth may reach the middle of the undoped GaN layer 105 without reaching the undoped AlGaN layer 104.

In the embodiments described above, the channels are n-channels with electrons as carriers, and the gate is a p-type semiconductor, however, without being limited to this configuration, the channels may be p-channels with holes as carriers, and the gate may be an n-type semiconductor.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is useful for field effect transistors and the method of manufacturing them, and is particularly useful for power transistors used in power supply circuits of household equipment such as televisions.

What is claimed is:

1. A junction field effect transistor comprising:
    a first nitride semiconductor layer;
    a second nitride semiconductor layer formed on said first nitride semiconductor layer, said second nitride semiconductor layer having a band gap energy greater than a band gap energy of said first nitride semiconductor layer;
    a third nitride semiconductor layer formed on said second nitride semiconductor layer;
    a fourth nitride semiconductor layer formed on said third nitride semiconductor layer, said fourth nitride semiconductor layer having a band gap energy greater than a band gap energy of said third nitride semiconductor layer;
    a fifth semiconductor layer formed in a recess provided in said third nitride semiconductor layer and said fourth nitride semiconductor layer;
    a gate electrode formed on said fifth semiconductor layer; and
    a source electrode and a drain electrode which are formed in respective regions near lateral sides of said gate electrode, wherein:
    a channel is formed at a heterojunction interface between said first nitride semiconductor layer and said second nitride semiconductor layer, and
    said fifth semiconductor layer is in contact with said third nitride semiconductor layer at an inner side surface of said recess.

2. The junction field effect transistor according to claim 1, wherein the recess penetrates through a heterojunction interface between said third nitride semiconductor layer and said fourth nitride semiconductor layer.

3. The junction field effect transistor according to claim 2, wherein:
    the recess penetrates through said third nitride semiconductor layer and said fourth nitride semiconductor layer to reach a surface of said second nitride semiconductor layer, and
    the surface of said second nitride semiconductor layer as a bottom surface of the recess is flush with an interface between said second nitride semiconductor layer and said third nitride semiconductor layer.

4. The junction field effect transistor according to claim 1, said fifth semiconductor layer has a sixth nitride semiconductor layer thereunder.

5. The junction field effect transistor according to claim 1, wherein a difference in lattice constants between said second nitride semiconductor layer and said sixth nitride semiconductor layer is less than a difference in lattice constants between said second nitride semiconductor layer and said fifth semiconductor layer.

6. The junction field effect transistor according to claim 3, further comprising:
    a seventh nitride semiconductor layer of a first conductivity type formed on said fourth nitride semiconductor layer; and
    an eighth nitride semiconductor layer of a first conductivity type formed on said seventh nitride semiconductor layer, said eighth nitride semiconductor layer having a band gap energy greater than a band gap energy of said seventh nitride semiconductor layer.

7. The junction field effect transistor according to claim 6, wherein said source electrode and said drain electrode each of which is in contact with the heterojunction interface between said first nitride semiconductor layer and said second nitride semiconductor layer, and with the heterojunction interface between said third nitride semiconductor layer and said fourth nitride semiconductor layer.

8. The junction field effect transistor according to claim 7, wherein:
    said first nitride semiconductor layer includes GaN,
    said second nitride semiconductor layer is composed of $Al_xGa_{1-x}N$ ($0<x \leq 1$),
    said third nitride semiconductor layer is composed of $Al_yGa_{1-y}N$ ($0 \leq y \leq 1$),
    said fourth nitride semiconductor layer is composed of $Al_zGa_{1-z}N$ ($0 \leq z \leq 1$), and
    said fifth semiconductor layer is composed of $Al_\alpha Ga_{1-\alpha}N$ ($0 \leq \alpha \leq 1$).

9. The junction field effect transistor according to claim 8, wherein said junction field effect transistor is a normally-off transistor.

10. The junction field effect transistor according to claim 1, wherein:
    said first nitride semiconductor layer includes GaN, said second nitride semiconductor layer is composed of $Al_xGa_{1-x}N$ ($0<x \leq 1$),
    said third nitride semiconductor layer is composed of $Al_yGa_{1-y}N$ ($0 \leq y \leq 1$),
    said fourth nitride semiconductor layer is composed of $Al_zGa_{1-z}N$ ($0 \leq z \leq 1$), and
    said fifth semiconductor layer is composed of $Al_xGa_{1-\alpha}N$ ($0 \leq \alpha \leq 1$).

11. The junction field effect transistor according to claim 1, wherein said junction field effect transistor is a normally-off transistor.

12. The junction field effect transistor according to claim 1, wherein:
    the first nitride semiconductor layer has an impurity of a first conductivity type, the second nitride semiconductor layer has an impurity of a first conductivity type, the third nitride semiconductor layer has an impurity of a first conductivity type, the fourth nitride semiconductor layer has an impurity of a first conductivity type, and the fifth semiconductor layer has an impurity of a second conductivity type.

13. The junction field effect transistor according to claim 1, wherein said fifth semiconductor layer is in contact with a surface of said fourth nitride semiconductor layer.

14. A junction field effect transistor comprising:

a first nitride semiconductor layer;

a second nitride semiconductor layer formed on said first nitride semiconductor layer, said second nitride semiconductor layer having a band gap energy greater than a band gap energy of said first nitride semiconductor layer;

a third nitride semiconductor layer formed on said second nitride semiconductor layer;

a fourth nitride semiconductor layer formed on said third nitride semiconductor layer, said fourth nitride semiconductor layer having a band gap energy greater than a band gap energy of said third nitride semiconductor layer;

a fifth semiconductor layer formed in a recess provided in said third nitride semiconductor layer and said fourth nitride semiconductor layer;

a gate electrode formed on said fifth semiconductor layer;

a source electrode and a drain electrode which are formed in respective regions near lateral sides of said gate electrode; and a sixth nitride semiconductor layer formed between said second nitride semiconductor layer and said fifth semiconductor layer, wherein:

a channel is formed at a heterojunction interface between said first nitride semiconductor layer and said second nitride semiconductor layer, said sixth nitride semiconductor layer is in contact with an inner side surface of said recess and a surface of said fourth nitride semiconductor layer, and a side portion of said sixth nitride semiconductor layer extends closer to said source electrode than a side portion of said fifth semiconductor layer, said side portion of said sixth nitride semiconductor layer and said side portion of said fifth semiconductor layer facing said source electrode.

15. The junction field effect transistor according to claim 14, wherein the fifth semiconductor layer is thicker than the sixth semiconductor layer.

16. The junction field effect transistor according to claim 14, wherein a portion of the sixth semiconductor layer at a bottom portion of the recess has a substantially same thickness of a portion of the sixth semiconductor layer on a surface of the fourth nitride semiconductor layer.

17. The junction field effect transistor according to claim 14, wherein said source electrode and said drain electrode penetrate through said sixth nitride semiconductor layer.

18. The junction field effect transistor according to claim 14, wherein:

the fifth semiconductor layer has an impurity of a second conductivity type, and the sixth semiconductor layer has an impurity of a second conductivity type.

* * * * *